(12) United States Patent
Ozaki et al.

(10) Patent No.: US 6,720,274 B2
(45) Date of Patent: Apr. 13, 2004

(54) METHOD FOR FABRICATING A SEMICONDUCTOR DEVICE AND A SUBSTRATE PROCESSING APPARATUS

(75) Inventors: Takashi Ozaki, Tokyo (JP); Kenichi Suzaki, Tokyo (JP); Norikazu Mizuno, Tokyo (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 10/291,474

(22) Filed: Nov. 12, 2002

(65) Prior Publication Data

US 2003/0092283 A1 May 15, 2003

(30) Foreign Application Priority Data

Nov. 13, 2001 (JP) ........................................ 2001-347628
Dec. 12, 2001 (JP) ........................................ 2001-378915

(51) Int. Cl.$^7$ ........................ H01L 21/31; H01L 21/469
(52) U.S. Cl. ........................ 438/758; 438/800; 438/935; 438/941; 414/935; 414/941; 29/25.01
(58) Field of Search ................................ 438/758, 800, 438/935, 941; 414/935, 939; 29/25.01

(56) References Cited

U.S. PATENT DOCUMENTS

| 5,540,098 A | * | 7/1996 | Ohsawa ........................ 73/629 |
| 6,066,210 A | * | 5/2000 | Yonemitsu et al. .......... 118/719 |
| 6,143,083 A | * | 11/2000 | Yonemitsu et al. .......... 118/719 |
| 6,573,178 B1 | * | 6/2003 | Nakamura .................... 438/643 |
| 2003/0053893 A1 | * | 3/2003 | Matsunaga et al. .......... 414/217 |
| 2003/0077150 A1 | * | 4/2003 | Matsuda et al. ............ 414/217 |

* cited by examiner

*Primary Examiner*—Alexander Ghyka
(74) *Attorney, Agent, or Firm*—Bacon & Thomas

(57) ABSTRACT

A semiconductor device fabricating method includes the steps of loading one or more substrates into a boat disposed in a waiting room positioned next to a reaction furnace; vacuum-evacuating the waiting room to a vacuum state at a base pressure; loading the boat into the reaction furnace at a first ambient pressure; and recovering a temperature of the reaction furnace at a second ambient pressure. The first or the second ambient pressure is greater than the vacuum state but less than the atmospheric pressure. Further, the method includes the step of increasing the temperature of the one or more substrates at a third ambient pressure, and also the third ambient pressure is greater than the base pressure but less than the atmospheric pressure.

13 Claims, 13 Drawing Sheets

PORTION INSERTED
IN SUPPORTING GROOVE

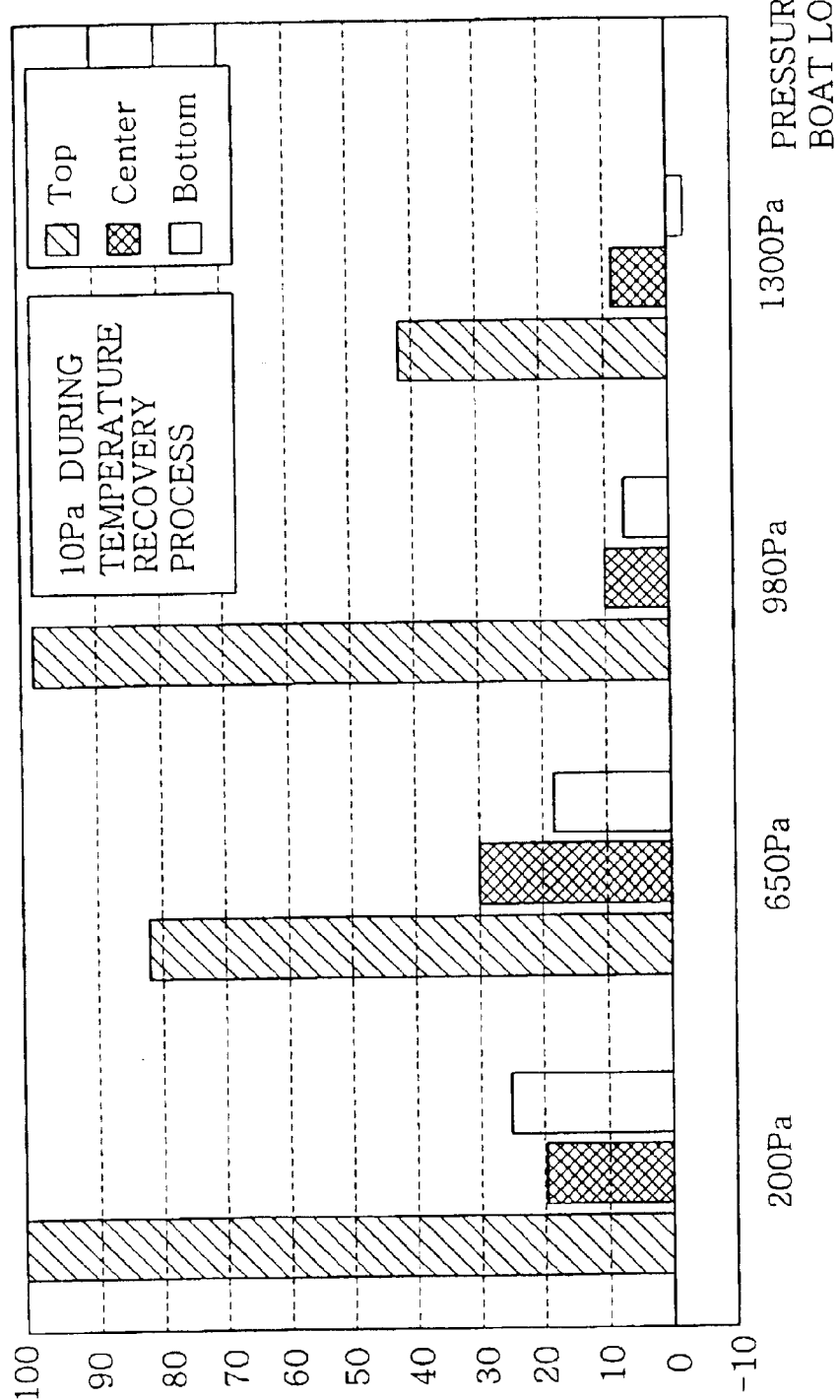

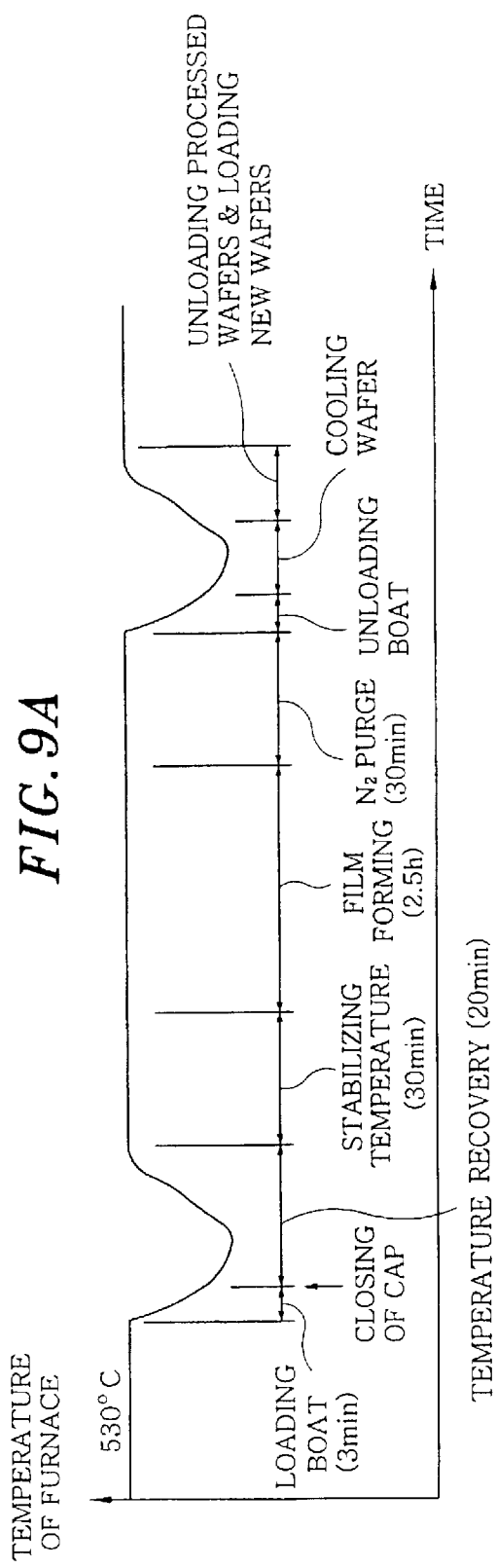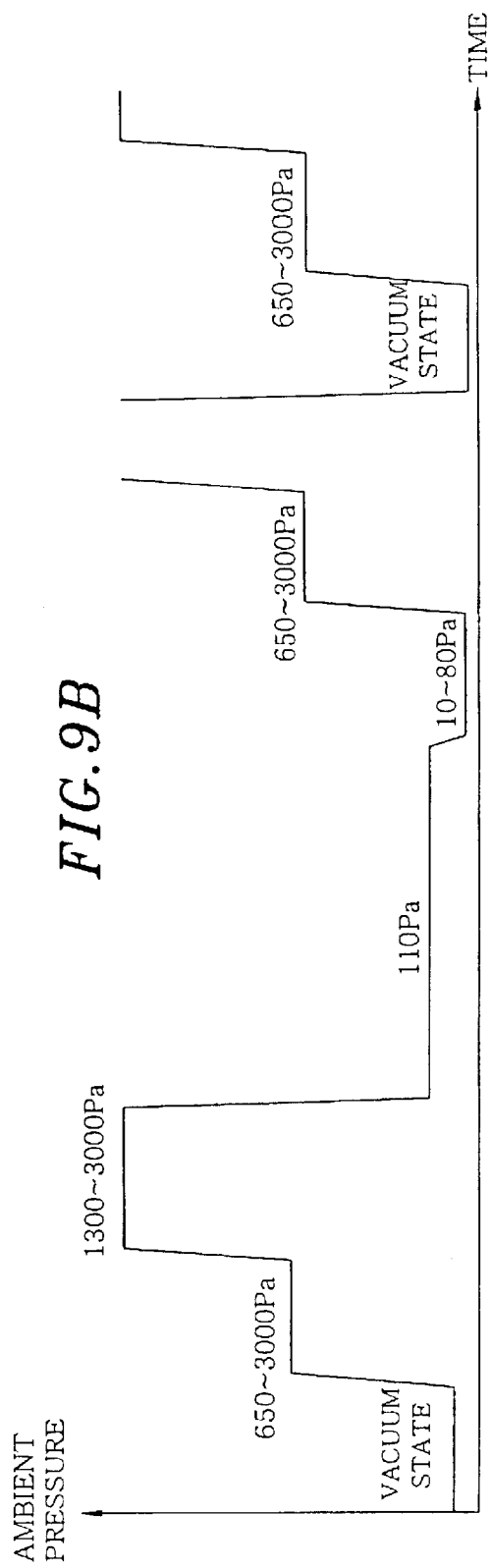

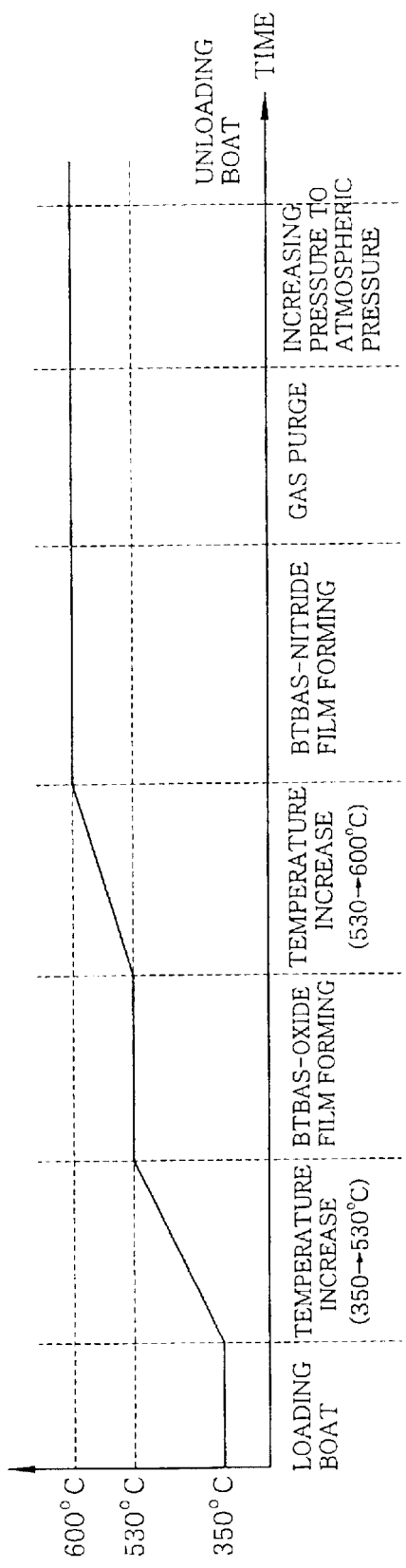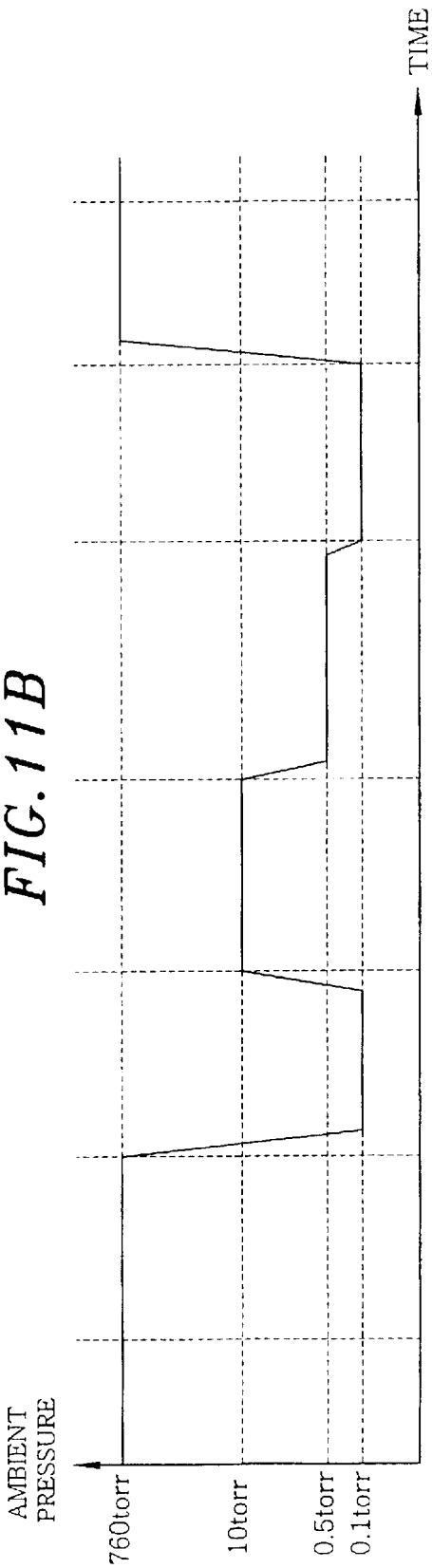

PORTION INSERTED IN SUPPORTING GROOVE

METHOD FOR FABRICATING A SEMICONDUCTOR DEVICE AND A SUBSTRATE PROCESSING APPARATUS

FIELD OF THE INVENTION

The present invention relates to a method for fabricating a semiconductor device and a substrate processing apparatus; and, more particularly, to a semiconductor device fabricating method including a depressurization process and a substrate processing apparatus performing same.

BACKGROUND OF THE INVENTION

Referring to FIG. 1, there is illustrated a conventional substrate processing apparatus having a vertical type reaction furnace.

In the substrate processing apparatus, a reaction tube 1 is mounted on a manifold 2, which also supports an inner tube 3 that is vertically aligned with the reaction tube 1. The reaction tube 1 is enclosed by a tubular heater 4, wherein the reaction tube 1 and the tubular heater 4 constitute a reaction furnace.

The interior of the reaction tube 1 constitutes a hermetically sealed reaction chamber 5, which communicates with an airtight waiting room 6 defined within a load-lock chamber 7 connected to a lower portion of the manifold 2. Further, installed in the load-lock chamber 7 is a boat elevator 30 for loading and unloading a substrate holder 8 (hereinafter, referred to as a boat 8) into and from the reaction chamber 5, wherein an elevator cap 9 is used to hermetically close the reaction chamber 5 after the boat 8 is completely loaded thereinto.

The load-lock chamber 7 has a gate valve therein (not shown), and a wafer transferring device (not shown) is installed outside the load lock chamber 7. The wafer transferring device performs loading and unloading of substrates 10 such as Si wafers (hereinafter, referred to as wafers 10) via the gate valve, while the boat 8 is stationed in the load-lock chamber 7.

Connected to the manifold 2 are a first gas supply line 11 and a first exhaust line 13, wherein the first gas supply line 11 introduces gas to the bottom portion of the inner tube 3. In a similar fashion, a second gas supply line 12 and a second exhaust line 14 are connected to the load-lock chamber 7. The exhaust lines 13, 14 are connected to an exhaust system (not shown) via air valves 15, 16, respectively.

The boat 8 holding a predetermined number of wafers 10 is loaded into the reaction chamber 5, which is then vacuum-evacuated, and the boat 8 and the wafers 10 are heated by the heater 4 therein. A reaction gas then is supplied to the reaction chamber 5 through the first gas supply line 11, while the reaction chamber 5 being exhausted in order to maintain a predetermined depressurized state, so that film forming process can take place under a specified process condition. After a completion of the wafer process, the boat 8 is de-elevated and wafers 10 are unloaded therefrom.

Conventionally, the reaction chamber 5 and the waiting room 6 are both either kept in the atmospheric state or supplied with nitrogen gas thereto, while the boat 8 is being loaded into the reaction furnace.

However, when the reaction chambers 5 and the waiting room 6 are both kept in the atmospheric state, formation of natural oxide films on the wafers 10 occurs during the process of loading the boat 8 into the reaction chamber 5, which entails an adverse effect on the semiconductor device.

On the other hand, by supplying nitrogen gas into the reaction chamber 5 and the waiting room 6, the formation of the natural oxide film can be dramatically reduced compared to the aforementioned case. Since, however, oxygen can not be completely removed even in the nitrogen atmosphere, natural oxide film formation may not be completely prevented.

Therefore, another method has been introduced, in which the reaction chamber 5 and the waiting room 6 are vacuum-evacuated during the process of transferring the boat 8 between the reaction chamber 5 and the load-lock chamber 7. In this case, the formation of natural oxide films is further suppressed compared to the aforementioned two cases.

However, it has been found by the inventors of the present invention that while the vacuum-evacuated reaction chamber 5 and the waiting room 6 suppresses formation of natural oxide films, contaminant particles are formed on the wafers 10.

In particular, significant generation of such contaminant particles was observed during the time at which the boat 8 is loaded into the reaction chamber 5 and the temperature recovery period (recovering temperature loss, which occurs during loading of the boat 8) of the reaction chamber 5 and also, while the temperature of the wafers 10 was raised to a processing temperature.

SUMMARY OF THE INVENTION

It is therefore, an object of the present invention to provide a substrate processing apparatus and a method for fabricating semiconductor devices, which reduces a formation of natural oxide film and generation of contaminant particles, thus improving quality of semiconductor devices.

In accordance with one aspect of the present invention, there is provided a semiconductor device fabricating method, including the steps of: loading one or more substrates into a boat disposed in a waiting room positioned next to a reaction furnace; vacuum-evacuating the waiting room to a vacuum state at a base pressure; loading the boat into the reaction furnace at a first ambient pressure; and recovering a temperature of the reaction furnace at a second ambient pressure, wherein the first or the second ambient pressure is greater than the base pressure but less than the atmospheric pressure.

In accordance with another aspect of the invention, there is provided a semiconductor device fabricating method, including the steps of: vacuum-evacuating a reaction furnace to a vacuum state at a base pressure; loading a boat having one or more substrates into the reaction furnace; recovering a temperature of the reaction furnace at a recovery pressure; and processing said one or more substrates by supplying one or more processing gases into the reaction furnace, wherein the recovery pressure is greater than the base pressure but less than the atmospheric pressure.

In accordance with still another aspect of the invention, there is provided a semiconductor device fabricating method, including the steps of: vacuum-evacuating a reaction furnace to a vacuum state at a base pressure; increasing a temperature of one or more substrates supported by a boat in the reaction furnace at an ambient pressure; and processing said one or more substrates by supplying one or more processing gases into the reaction furnace, wherein the ambient pressure is greater than the base pressure but less than the atmospheric pressure.

In accordance with still another aspect of the invention, there is provided a semiconductor device fabricating method, including the steps of: loading a boat having one or more substrates into a reaction furnace; vacuum-evacuating the reaction furnace to a vacuum state at base pressure; processing said one or more substrates by supplying one or more first processing gases into the reaction furnace at a first processing temperature and at a first ambient pressure; processing said one or more substrates by supplying one or more second processing gases into the reaction furnace at a second temperature and at a second ambient pressure; and performing a temperature change from the first processing temperature to the second processing temperature at an intermediate ambient pressure; and wherein the intermediate ambient pressure is greater than the base pressure but less than the atmospheric pressure.

In accordance with still another aspect of the invention, there is provided a substrate processing apparatus including: a reaction furnace for processing one or more substrates; a substrate holder for supporting said one or more substrates; a waiting room connected to the reaction furnace; a substrate holder transferring means for transmitting the substrate holder between the waiting room and the reaction furnace; and a pressure controlling means for maintaining the waiting room at a base pressure after loading said one or more substrates into the substrate holder disposed in the waiting room; at a first ambient pressure when loading the substrate holder from waiting room to the reaction furnace; a second ambient pressure in the reaction furnace while a temperature of the reaction furnace is recovered after loading the substrate holder thereinto; then a third ambient pressure in the reaction furnace while increasing a temperature of said one or more substrates to a processing temperature, wherein the first, the second or the third ambient pressure are higher than the base pressure but less than the atmospheric pressure.

In accordance with still another aspect of the invention, there is provided a substrate processing apparatus including: a reaction furnace for processing one or more substrates; a substrate holder for supporting said one or more substrates; a pressure controlling means for vacuum-evacuating the reaction furnace to a vacuum state at a base pressure; maintaining the reaction furnace at a first ambient pressure while a temperature of the reaction furnace is recovered after loading the substrate holder thereinto; and maintaining the reaction furnace at a second ambient pressure while increasing a temperature of said one or more substrates to a processing temperature, wherein the first or the second ambient pressure is higher than the base pressure but less than the atmospheric pressure.

BRIEF DESCRIPTION OF THE DRAWINGS

The above and other objects and features of the present invention will become apparent from the following description of preferred embodiments given in conjunction with the accompanying drawings, in which:

FIG. 8 is another bar graph displaying a relationship between increments in the contaminant particles formed on a wafer and ambient pressure during a boat loading process;

FIGS. 9A, 9B respectively depict first exemplary temperature and pressure profile in accordance with the present invention;

FIGS. 11A and 11B respectively provide second exemplary temperature and pressure profiles in accordance with the present invention;

DETAILED DESCRIPTION OF THE PREFERRED EMBODIMENTS

Figure 1:
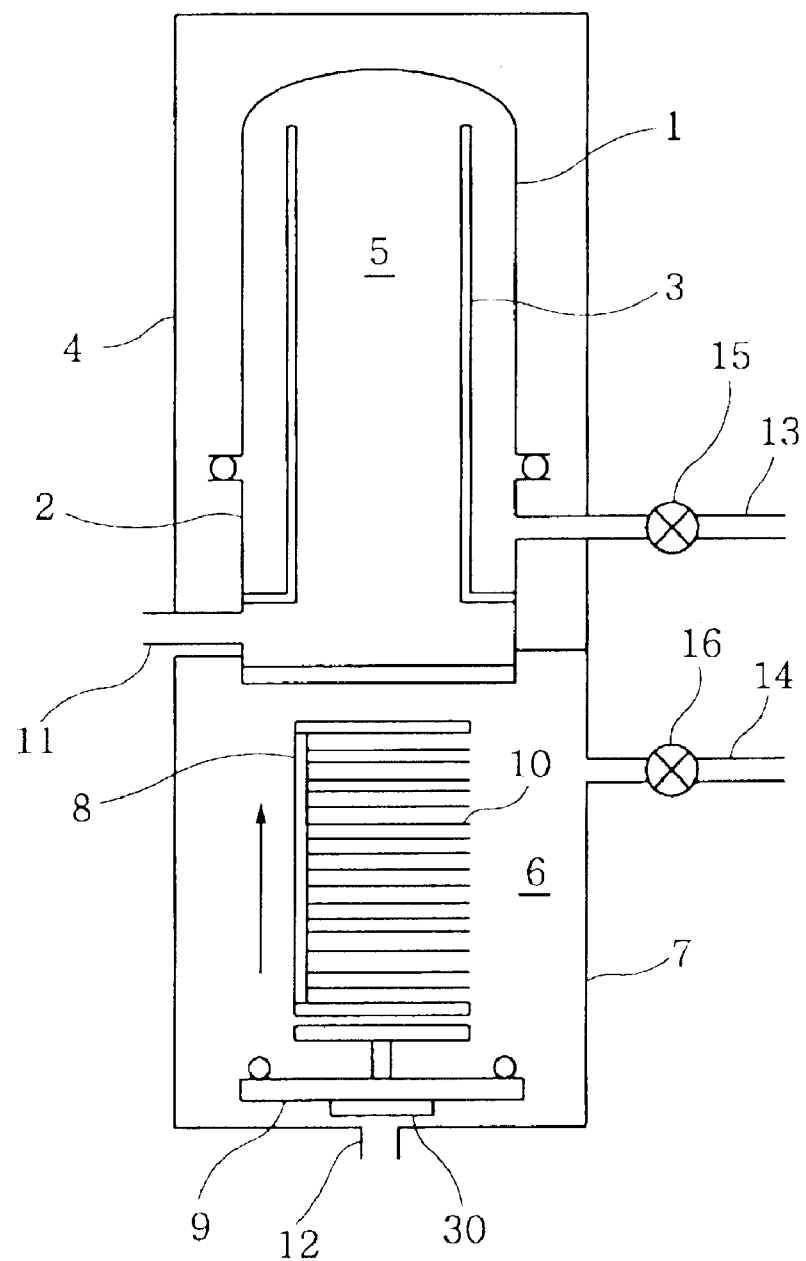
FIG. 1 illustrates a schematic cross sectional view of a conventional substrate processing apparatus.

The preferred embodiments of the present invention will now be described with reference to the accompanying drawings, and it should be noted that like parts appearing in the accompanying drawings are represented by like reference numerals. Loading and unloading of a boat in the present invention are performed in a depressurized state under a neutral or an inert atmosphere, e.g., by using a nitrogen gas.

As mentioned above, the inventors of the present invention found through a series of experiments and measurements that contaminant particles are mainly generated in a vacuum state, during a boat loading process into the reaction chamber, temperature recovery period, and processing temperature stabilization period, and that the generation of contaminant particles is a strong function of an ambient pressure.

Figure 2:
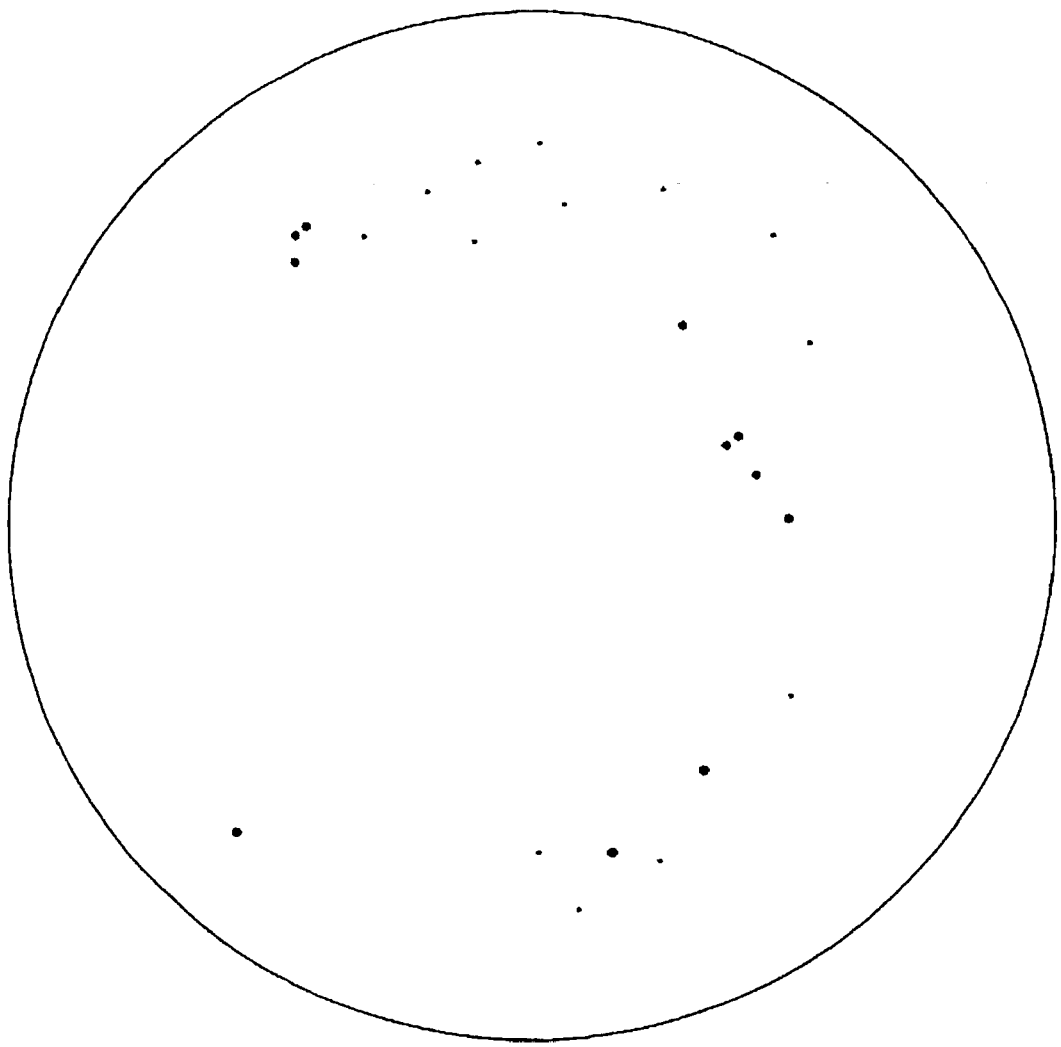
FIG. 2 describes a distribution of contaminant particles formed on a wafer, which has undergone a boat loading process in an atmospheric pressure state.

Referring to FIG. 2, there is illustrated a distribution of contaminant particles formed on a wafer 10, which has undergone a boat loading process in an atmospheric pressure state. There is provided in FIG. 3 another distribution of the contaminant particles attached on a wafer 10, which has undergone a boat loading process in a high vacuum state (200 Pa).

Figure 4:
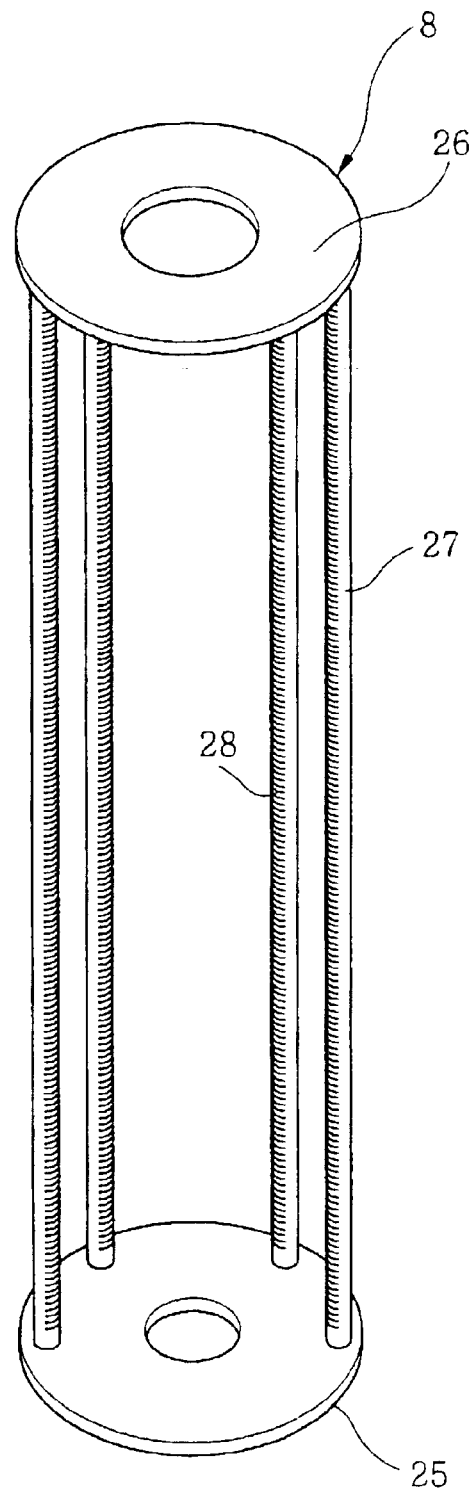
FIG. 4 provides a perspective view of a substrate holder.

There is illustrated in FIG. 4 a schematic perspective view of a boat 8 used in the boat loading processes mentioned above.

The boat 8 includes a top and bottom plates 26, 25 arranged at an upper and a lower position thereof, respectively, wherein four supporting bars 27 connects the bottom and the top plates 25, 26. A plurality of supporting grooves 28 are formed in the supporting bars 27 with predetermined intervals therebetween to hold wafers 10.

As shown in FIG. 2, when the boat loading process is carried out in the atmospheric ambient pressure, the amount of the contaminant particles attached on a wafer is small, and there seems to be no correlation between the contaminant particle distribution and the boat 8. In addition, under such a condition, the number of attached contaminant particles is about 0 to 10 per wafer.

Figure 3:
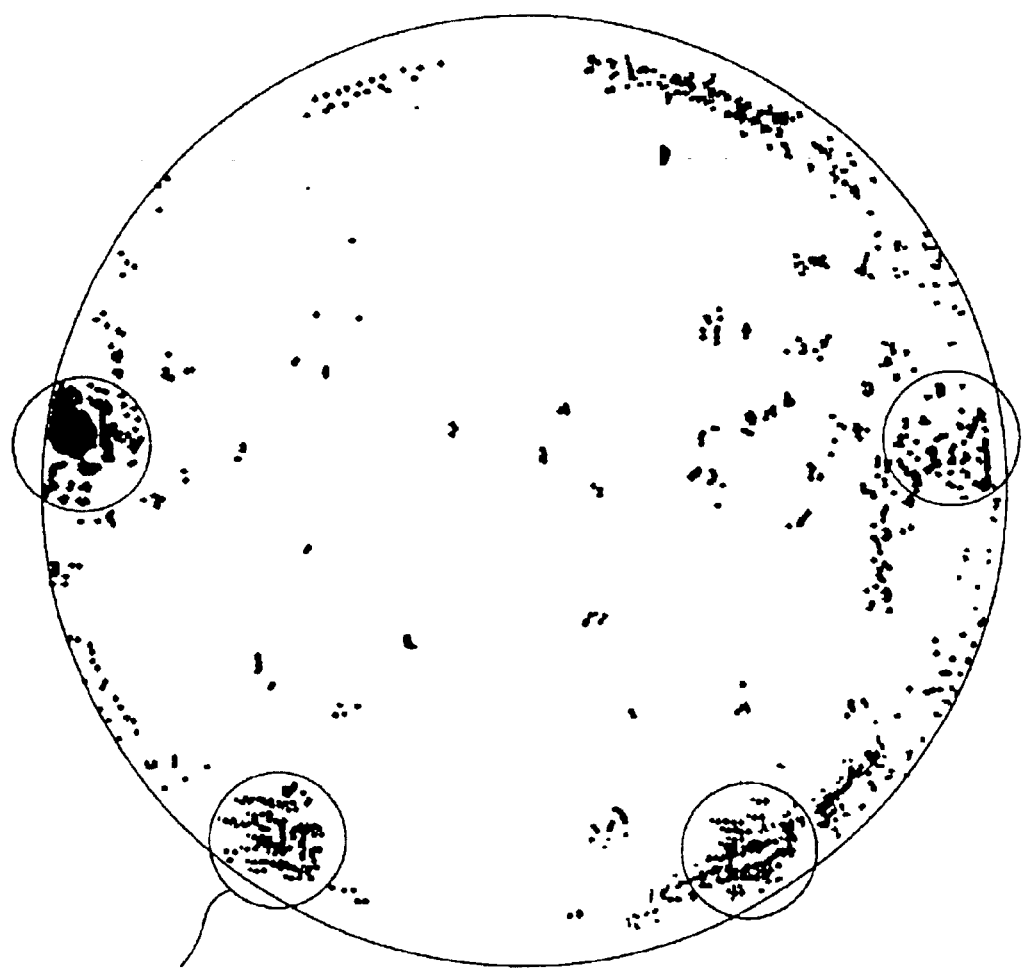
FIG. 3 shows a distribution of contaminant particles formed on a wafer, which has undergone a boat loading process in a vacuum state.

As shown in FIG. 3, the amount of the contaminant particles increased across the whole surface of a wafer 10 when the boat loading process is performed in the high vacuum state. The increase of the contaminant particle is significant especially at the portions of the wafer 10 inserted into the supporting grooves 28. That is, there occurs a correlation between the contaminant particle distribution and the boat 8.

The inventors of the present invention analyzed the above-mentioned phenomena and established a contaminant particle generation mechanism as follows:

When the ambient pressure of the boat 8 holding a plurality of wafers is in a vacuum state or a depressurized state, an air pocket between the peripheral surface of each wafer and the corresponding supporting groove 28 of the supporting bars 27 is reduced or eliminated thus solid surface contact is formed therebetween, thereby resulting in an increase of a friction coefficient therebetween. In other words, the friction coefficient therebetween is increased, as the level of vacuum of the boat ambience gets higher.

Figure 5:
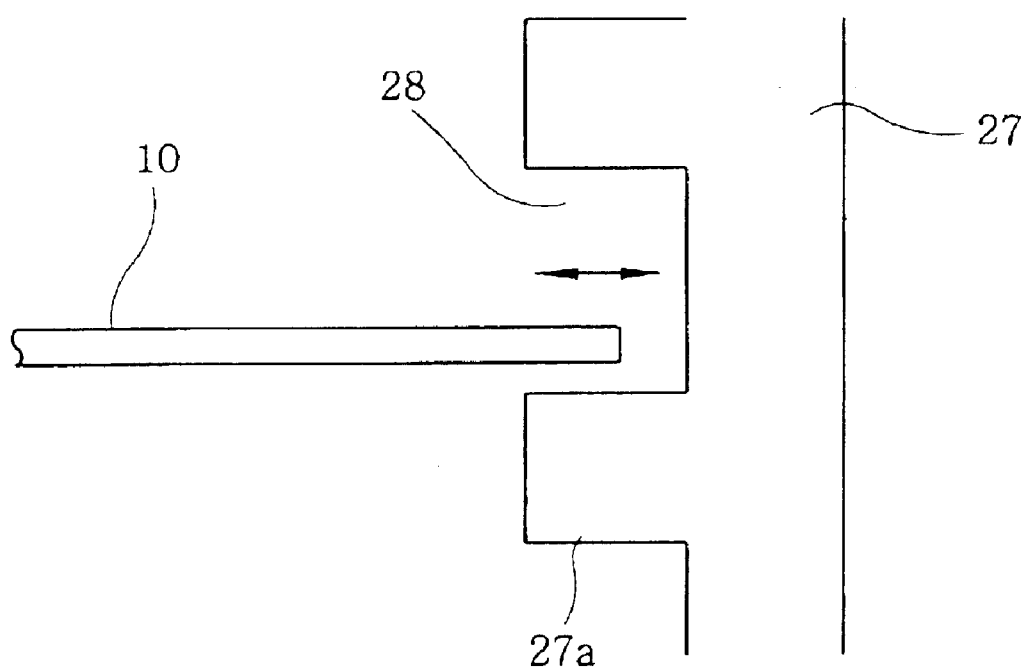
FIG. 5 sets forth a displacement between a periphery edge of a wafer and a supporting groove.

Further, during the time when the boat 8 is loaded into the reaction furnace and when the inner temperature of a reaction furnace is recovered and increased to a predetermined target temperature of the wafer, variability in displacement between the wafer and a supporting portion 27a of the boat 8 occurs as illustrated in FIG. 5 due to various reasons, e.g., vibration, a thermal expansion and warping of the wafer 10 induced by heat given to the wafer 10 and the boat 8, a deformation of the boat 8, a temperature difference between the boat 8 and the wafer 10, and intra-wafer non-uniformity in temperature.

Accordingly, under a vacuum state in which frictional force between the wafer 10 and the boat 8 is increased, surface layers of the wafer 10 and the boat 8 in contact are eroded or peeled off due to a heavy frictional contact therebetween, forming contaminant particles on the wafers 10.

Based on the above-mentioned analytical result, the loading of the boat 8, the temperature recovery, and an increase of the wafer processing temperature are preferably carried out in an inert or neutral gas ambience and a depressurized state in accordance with the present invention, wherein the ambient pressure is greater than a predetermined value. Moreover, until the intra-wafer temperature is stabilized, the ambient pressure is maintained at a particular depressurized state, instead of at a high vacuum state.

Figure 6:
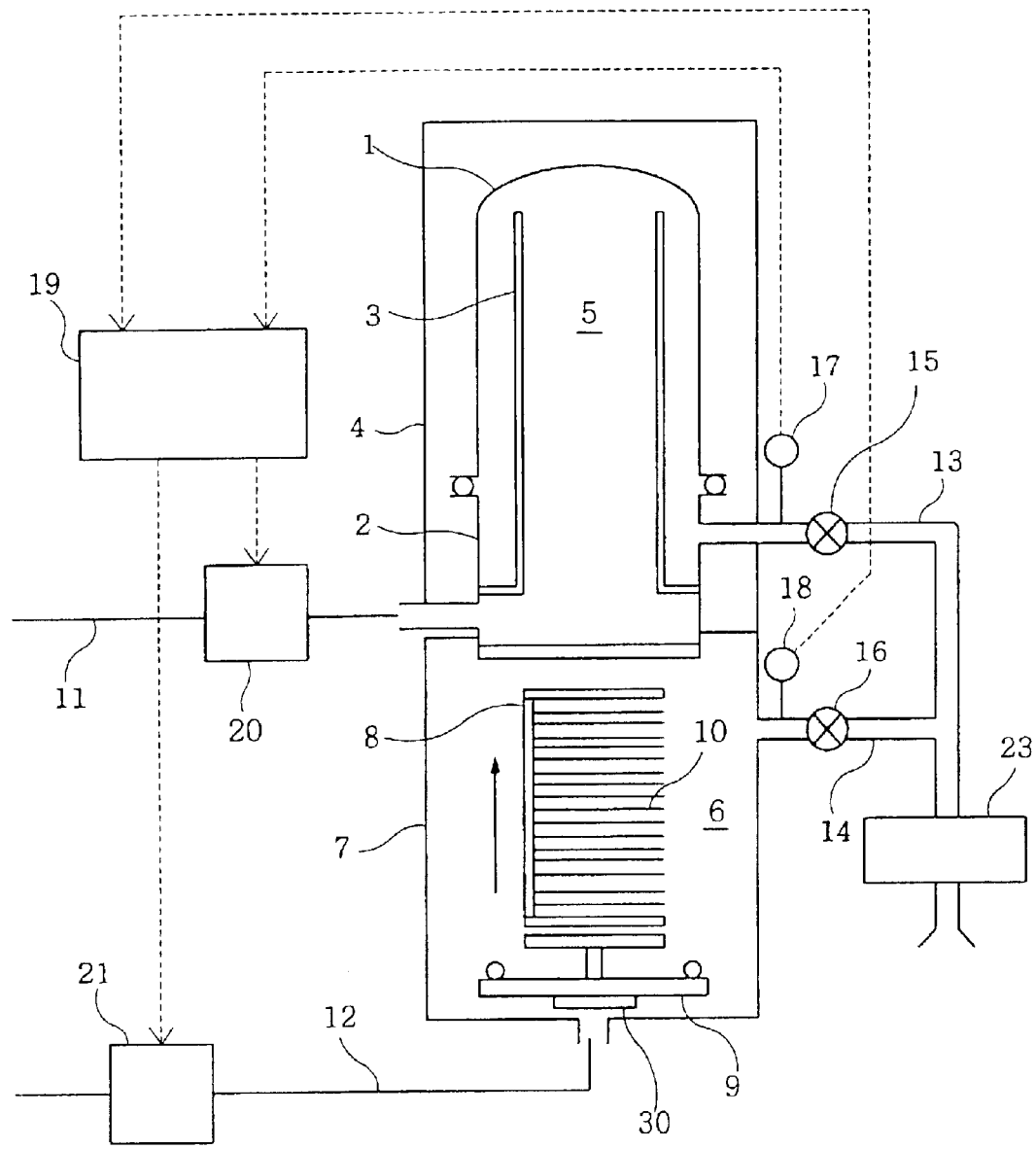
FIG. 6 represents a schematic cross sectional view of a substrate processing apparatus in accordance with the present invention.

With reference to FIG. 6, there is provided a schematic substrate processing apparatus in accordance with a first preferred embodiment of the present invention. Description for such parts and structure as described in FIG. 1 will be omitted for simplicity.

A first and a second pressure sensors 17, 18 are installed in a first and a second exhaust lines 13, 14, respectively, each sensor transmitting a signal indicating a result of a measurement to a pressure controller 19. The first and the second exhaust lines 13, 14 are connected to an exhaust pump 23.

A first and a second flow rate controlling devices 20, 21 are installed in a first and a second gas supply lines 11, 12, respectively. Under the control of the pressure controller 19, the first flow rate controlling device 20 controls a flow rate of a gas supplied to a reaction chamber 5 by the first gas supplying line 11, and similarly, the second flow rate controlling device 21 controls a flow rate of gas supplied to a waiting room 6 by the second gas supplying line 12.

The wafer processing processes, e.g., film forming process, are carried out in a similar manner in the substrate processing apparatus of FIG. 1, and thus the description thereof will be omitted for simplicity. The inner pressures of the reaction chamber 5 and the waiting room 6 can be controlled to a vacuum or a depressurized state by cutting off the gas supply by shutting off the first and second flow rate controlling devices 20, 21 under the control of the pressure controller 19, while opening up the air valves 15, 16 and evacuating the reaction chamber 5 and the waiting room 6 by the vacuum pump 23.

While the air valves 15, 16 are open and exhaust pump 23 is providing a vacuum-evacuated state, the signals indicating the inner pressures measured by the first and second pressure sensors 17, 18 are transmitted to the pressure controller 19 by a feedback mechanism, wherein the pressure controller 19 establishes desired measured pressures by controlling the gas flow rates through the first and second flow rate controlling devices 20, 21.

During the pressure adjusting and maintaining processes described above, an inert or a neutral gas, e.g., nitrogen gas, is supplied into the reaction chamber 5 and the waiting room 6 in order to suppress formation of natural oxide film.

Gases are independently supplied into the reaction furnace 5 and the waiting room 6, through the first and second gas supplying lines 11, 12, respectively, and gas evacuation therefrom are also performed separately by respective lines, i.e., the first and the second exhaust line 13, 14. Further, the reaction chamber 5 can be isolated from the waiting room 6 as well as being able to be communicated with the waiting room 6. Accordingly, it is possible to control respective pressures of the reaction furnace 5 and the waiting room 6 independently when the reaction chamber 5 is isolated from waiting room 6, while it is also possible to control pressures of the reaction furnace 5 and the waiting room 6 together as a single system when the isolation therebetween is released.

Figure 7:
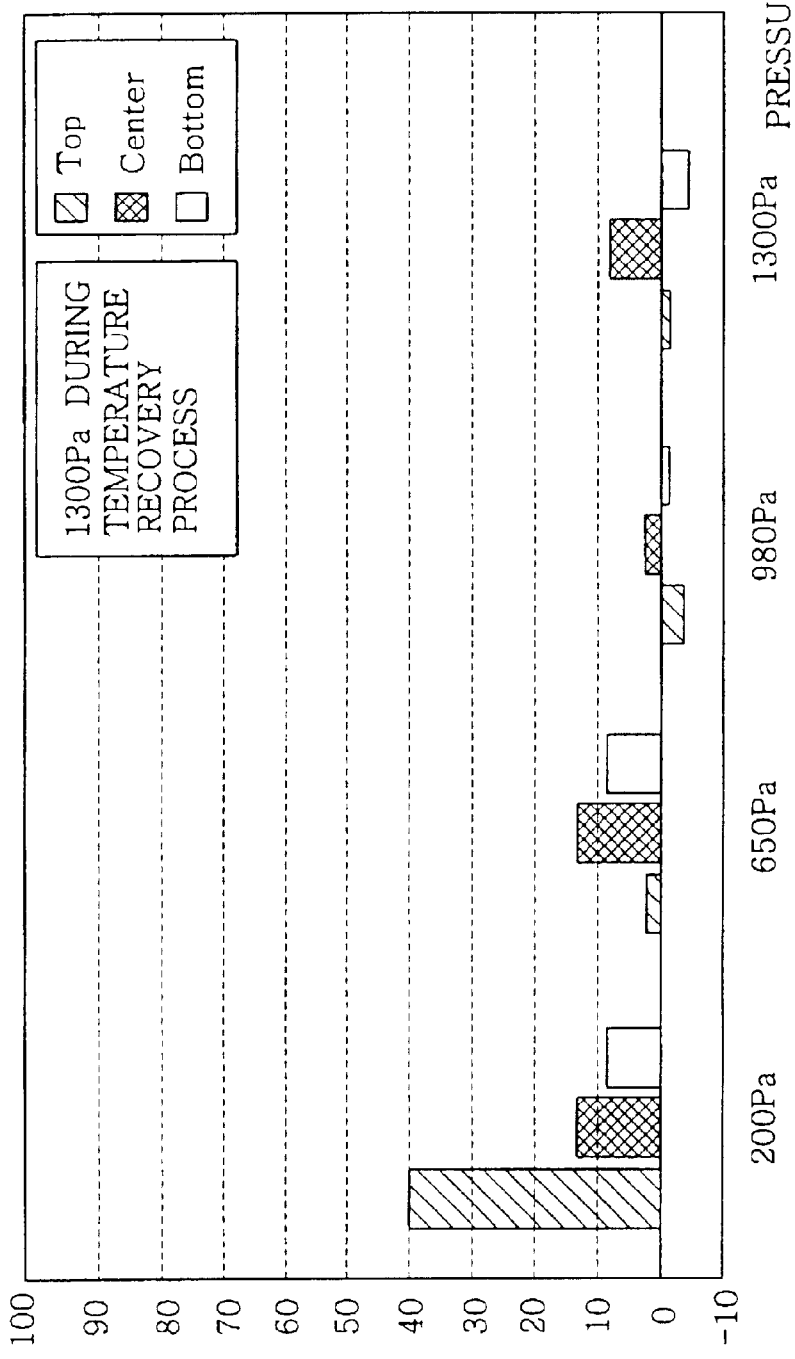
FIG. 7 is a bar graph displaying a relationship between increments in the contaminant particles formed on a wafer and an ambient pressure during a boat loading process.

Referring to FIGS. 7 and 8, there are illustrated a relationship between the increment in contaminant particle and the ambient pressure, wherein the ambient pressure indicates a pressure of a confined space in which the boat 8 is contained. That is, when the boat 8 is disposed within the reaction chamber 5, which is hermetically closed by an elevator cap 9, the ambient pressure is the inner pressure of the reaction chamber 5, whereas for example, if the reaction furnace is communicated with the waiting room 6, and the boat 8 is being loaded into the reaction chamber 5, the confined space in which the boat 8 is contained is a sum of the reaction chamber 5 and the waiting room 6, and therefore the ambient pressure is the pressure of either the reaction chamber 5 or the waiting room 6.

In addition, the increment in contaminant particles indicates an amount by which the number of contaminant particles formed on a wafer was increased during the processing of the wafer. In the following experiments, $N_2$ was used.

Referring back to FIG. 7, a series of experiments were conducted under a condition, in which the respective ambient pressures during the boat loading process were 200 Pa, 650 Pa, 980 Pa and 1300 Pa, and the ambient pressure during the temperature recovery process was set to be 1300 Pa for all the cases. For each experiment, three measurements of the contaminant particle increment were made, each corresponding to top, center or bottom portion of the boat 8.

According to the results illustrated in FIG. 7, it can be seen that the overall contaminant particle increment generally is reduced as the ambient pressure during the boat loading process was increased from about 200 Pa to about 650 Pa, 980 Pa, and 1300 Pa, respectively, however, ambient pressure greater than 980 Pa does not show a significant improvement in reducing contaminant particle increment.

Referring back to FIG. 8, a series of experiments were conducted under a condition, in which the ambient pressure during the boat loading process was varied from about 200 Pa to about 650 Pa, 980 Pa, and 1300, respectively, and the ambient pressure during the temperature recovery process was set to be 10 Pa for all the cases. For each experiment, three measurements of the contaminant particle increment were made, each corresponding to top, center or bottom portion of the boat 8.

The experiments illustrated in FIG. 8 shows that the overall contaminant particle increment at every portion of the wafer is generally reduced as the ambient pressure during the boat loading process is raised from about 200 Pa to about 1300 Pa.

Comparing the experiments of FIG. 7 with those of FIG. 8, the former having a higher ambient pressure during the temperature recovery period, yields a reduced contaminant particle increment. Thus, it can be concluded that the higher ambient pressure during the temperature recovery process yields less contaminant particle increment.

That is, the contaminant particle increment can be reduced by setting the ambient pressure during the temperature recovery period high. Moreover, the same effect can be obtained by setting the ambient pressure high, while raising the temperature of the reaction chamber 5, because the generation of particles is related to temperature difference between a boat 8 and a wafer 10 therein and intra-wafer non-uniformity in temperature.

In view of the results illustrated in FIG. 7, in case of setting the ambient pressure to be relatively high, e.g., 1300 Pa, during the temperature recovery period, the contaminant particles are generated in great amount when the ambient pressure during the boat loading process is low, e.g., 200 Pa. However, the amount of the contaminant particles is reduced as the ambient pressure during the boat loading process is raised. In particular, if the ambient pressure during the boat loading process becomes equal to or greater than about 650 Pa, substantially identical results are obtained as in the case where the atmospheric ambient pressure is maintained during the boat loading process.

Further, vast amounts of particles are generated when the ambient pressure during the temperature recovery process is set to be a high vacuum state, e.g., equal to or less than 10 Pa as in FIG. 8; but the generation of the contaminant particles is reduced phenomenally when the ambient pressure during the temperature recovery process is set to as high as 1300 Pa. In particular, establishing ambient pressure during the boat loading process at about 650 Pa, yields an equivalent result as in establishing the ambient pressure at the atmospheric pressure.

Further, contaminant particle increments under a condition, wherein the ambient pressure during the boat loading process is set to be at least about 650 Pa and the ambient pressure during the temperature recovery process is set to be about 1300 Pa, are almost the same as those under the atmospheric pressure.

As aforementioned, contaminant particle generation can be reduced by increasing the ambient pressure, but if it is set to be unnecessary greater than a particular level, the formation of natural oxide film cannot be suppressed. Moreover, if the ambient pressure is too high, it will take more time to reduce the ambient pressure down to a wafer processing pressure because pressure difference therebetween becomes substantial, deteriorating throughput yields. For example, the film forming pressure at about 110 Pa when D-poly Si layer (phosphorus doped polycrystalline Si film) is formed by employing $SiH_4$ and $PH_3$. Accordingly, it is preferable that practical maximum ambient pressure be at about 3000 Pa. Under such condition, lowering the maximum ambient pressure to the film forming pressure does not affect the throughput, and the formation of the natural oxide film can also be suppressed effectively.

A film forming process of D-poly Si layer in accordance with a first preferred embodiment of the invention based on temperature and pressure profiles shown in FIGS. 9A, 9B will now be described with reference to FIG. 6.

The reaction chamber temperature is maintained constant, e.g., at about 530° C. to form a D-poly Si layer.

The reaction chamber 5 is closed and the wafers 10 are loaded into the boat 8 in the waiting room 6. Then, the waiting room 6 is closed, and thereafter the reaction chamber 5 and the waiting room 6 are vacuum-evacuated to a high vacuum state. Vacuum-evacuation is performed in the reaction chamber 5 and the waiting room 6 by evacuating the gas therein through the exhaust lines 13, 14, while the gas supply is cut off. The ambient pressure of the vacuum-evacuated reaction chamber 5 and the waiting room 6 is less than that during the film forming process, and thus, the formation of the natural oxide film is effectively suppressed.

In the ensuing step, the pressure controller 19 controls the first and the second flow rate controlling device 20, 21 to introduce an inert or a neutral gas, e.g., nitrogen gas, into the reaction chamber 5 and the waiting room 6 to establish ambient pressure, which ranges from about 650 to 3000 Pa. After the ambient pressure stabilizes within the range of about 650 to 3000 Pa, the reaction chamber 5 is opened and the boat 8 is loaded completely thereinto by the elevator 30.

A loss of heat (reduction in temperature) in the reaction chamber 5 associated with opening of the reaction chamber 5 and loading of the boat 8 thereinto is compensated and recovered to the film forming temperature, during which the pressure controller 19 controls the first flow rate controlling device 20, so that the inner pressure of the reaction chamber 5 is controlled to be in the range from about 1300 Pa to 3000 Pa.

After the reaction chamber temperature is stabilized at the film forming temperature, the film forming process is initiated. The inner pressure of the reaction chamber 5 required for forming a film depends on type of film to be formed, however, in the preferred embodiment, it is at about 110 Pa.

After the film forming process is completed, the reaction chamber 5 is purged by $N_2$ at a lower pressure level than at the film forming process. Next, the inner pressure of the reaction chamber 5 as well as that of the waiting room 6 is controlled and stabilized within the range from about 650 to 3000 Pa. The reaction chamber 5 is then opened and the boat 8 is unloaded therefrom, while the ambient pressure is maintained in the range from about 650 to 3000 Pa. The unloaded boat 8 and the wafers 10 are cooled in the waiting room 6. Thereafter, the load-lock chamber 7 is opened and the processed wafers 10 are unloaded from the boat 8 and wafers to be processed are loaded thereinto by the wafer transfer device (not shown).

In the preferred embodiment described above, since the ambient pressure during the temperature recovery process ranges from about 1300 to 3000 Pa, and the ambient pressure during the boat loading process ranges from about 650 to 3000 Pa, the contaminant particle increment in such case corresponds to the experiments conducted under the boat loading ambient pressures of 650 Pa and higher illustrated in FIG. 7.

It is advantageous in suppressing the formation of the natural oxide film to establish a lower boundary of the ambient pressure range during the boat loading process to be lower than that of the temperature recovery process. Such being the case, the ambient pressure during the boat loading process is established so that it ranges from about 650 Pa to about 3000 Pa, whereas during the temperature recovery process, it ranges from about 1300 Pa to 3000 Pa. Specifically, the most predominant formation of the natural oxide film usually occurs while the boat 8 is being loaded into the reaction chamber 5, and less predominant formation of natural oxide film occurs during the temperature recovery period, while the boat 8 being placed in a hermetically closed reaction chamber 5. Accordingly, it is preferable that the boat ambient pressure is maintained at a lower pressure range during the boat loading process in order for the formation of the natural oxide film to be suppressed. In contrast, during the temperature recovery process, formation of contaminant particles is more problematic than formation of natural oxide film, thus it is preferable to maintain a higher ambient pressure during the temperature recovering process in order to suppress generation of the contaminant particles.

Furthermore, it is to be understood that the principle of the ambient pressure controlling method described above carried out under a constant reaction chamber temperature can also be equally applied to other film forming processes that require temperature ramping up and down stages in the reaction furnace. In other words, if a substrate processing process carried out inside the reaction chamber 5 involves a temperature ramping up or down stage, it is preferable to carry out such a temperature varying stage at a higher ambient pressure in order to suppress the generation of contaminant particles.

Further, as illustrated in FIGS. 7 and 8, the generation of the contaminant particles is suppressed by maintaining the ambient pressure higher than the high vacuum pressure level either during the boat loading process or during the temperature recovery process. For instance, even if the boat loading process is performed under a nitrogen gas ambience and at the atmospheric pressure, and the ambient pressure during the temperature recovery process is maintained in the range from about 1300 to 3000 Pa, the generation of the contaminant particles can be suppressed.

That is, with reference to FIG. 6, the wafers 10 are loaded into the boat 8 in the waiting room 6, and then the waiting room 6 is closed. Thereafter, the inner space of the waiting room 6 and the reaction chamber 5 is supplied with nitrogen, at which, the reaction chamber 5 is opened and the boat 8 is loaded thereinto. At this time, the temperature of the reaction chamber 5 is reduced due to a loss of heat caused by the opening of the reaction chamber 5 and the loading of the boat 8 thereinto. The ambient pressure is maintained in the range of about 1300 to 3000 Pa, while the reduced temperature is recovered. Once the temperature is raised to a film forming temperature, the film forming process is conducted.

As illustrated above, even if the ambient pressure during the boat loading process is established at the atmospheric pressure, in the presence of nitrogen gas, and the ambient pressure during the temperature recovery period is maintained in the range of about 1300 to 3000 Pa, the generation of the contaminant particles can be suppressed.

Hereinafter, a second preferred embodiment of the present invention will now be described with reference to accompanying drawings.

Figure 10:
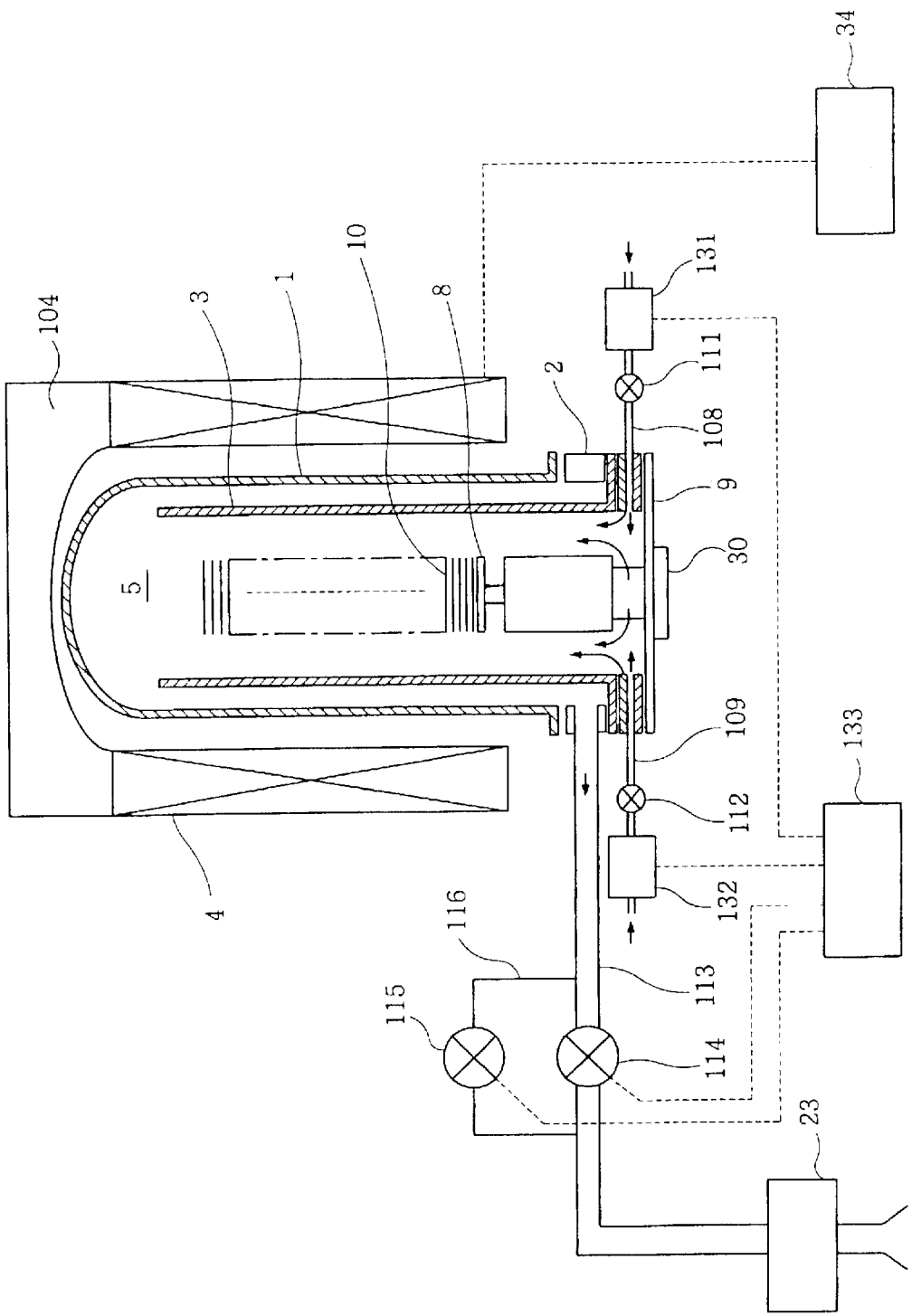
FIG. 10 represents a schematic cross sectional view of another substrate processing apparatus of the present invention.

Referring to FIG. 10, there is illustrated a wafer processing apparatus having a vertical type reaction furnace in accordance with the second preferred embodiment of the present invention.

A reaction tube 1 is mounted on a manifold 2, which supports an inner tube 3 that is concentrically provided inside the reaction tube 1. The reaction tube 1 is enclosed by a tubular heater 4, wherein the reaction tube 1, the tubular heater 4, and the inner tube 3 constitute a reaction furnace. The inner space of the inner tube 3 constitutes a reaction chamber 5, in which wafers 10 are processed. The inner temperature of the reaction chamber 5 is controlled by a controller 34, which controls the heat supplied by the heater 4.

A boat elevator 30 is utilized for loading and unloading a substrate holder 8 (hereinafter, referred to as a boat 8) into and from the reaction chamber 5, wherein an elevator cap 9 is used to hermetically close the reaction chamber 5 after the boat 8 is completely loaded thereinto. The boat 8 horizontally holds therein a plurality of wafers 10, which are processed while being loaded therein.

Connected to the reaction chamber 5 are a first and a second gas supply lines 108, 109, which have a first and second gate valves 111, 112, respectively, wherein each of the first and the second gas supply lines 108, 109 is connected to a gas source (not shown). Moreover, the gas supply lines 108, 109 are provided with a first and a second flow rate controlling device 131, 132, respectively, each of which controls the amount of gas supplied to the reaction chamber 5 through the corresponding gas line.

Also connected to the reaction tube 1 is a main exhaust line 113, which has a main exhaust valve 114, and the other end of the main exhaust line 113 is connected to a vacuum pump 23. In addition, attached to the main exhaust line 113 is a bypassing exhaust line 116 bypassing the main exhaust valve 114, which has a sub-exhaust valve 115.

The first and the second flow rate controlling devices 131, 132, the main exhaust valve 114, and the sub-exhaust valve 115 are controlled by a pressure controller 133, so that the inner pressure of the reaction chamber 5 can be regulated at a specified level.

Another example of wafer process will now be described with reference to FIGS. 11A and 11B.

In this example, the wafer process is a dual process in which a BTBAS(Bis-Teritary-Butyl-Amino Silane)-Oxide layer and a BTBAS-Nitride layer are formed consecutively on a silicon wafer. BTBAS and $O_2$ are used as material gases in forming BTBAS-Oxide layer, while a mixture gas of BTBAS and $NH_3$ are used in forming BTBAS-Nitride layer.

The inner pressure of the reaction chamber 5 is maintained at about 760 Torr (101325 Pa), when the boat 8 holding a predetermined number of the wafers 10 to be processed is loaded thereinto by the boat elevator 30. During the boat loading process, the temperature of the reaction chamber 5 is maintained at about 350° C. in order to suppress the formation of the natural oxide film.

In the ensuing step, the temperature of the reaction chamber 5 is raised from 350° C. to a wafer processing temperature, i.e., about 530° C., while the inner pressure of the reaction chamber 5 is maintained at about 760 Torr.

The reaction chamber 5 is vacuum-evacuated to reach 0.1 Torr (13.3 Pa) and supplied with BTBAS and $O_2$ by the first and the second gas supply lines 108, 109, so that the BTBAS-Oxide layers are formed on the wafers 10.

After the BTBAS-Oxide layer forming process is completed, the chamber 5 is vacuum-evacuated in order to release BTBAS and $O_2$ therefrom. Then, an inert or a neutral gas, e.g., $N_2$, is introduced thereinto, so that the inner pressure thereof is raised to about 10 Torr (1333 Pa). Afterwards the temperature of the reaction chamber 5 is raised from about 530° C. to BTBAS-Nitride layer forming temperature, i.e., 600° C.

Once the temperature of the reaction chamber 5 reaches 600° C., the inner pressure of the reaction chamber 5 is reduced down to about 0.5 Torr (66.7 Pa) and BTBAS and $NH_3$ are introduced thereinto by the first and the second gas supply lines 108, 109, forming BTBAS-Nitride layers.

After the BTBAS-Nitride film forming process is completed, the reaction chamber 5 is depressurized and purged, so that BTBAS, $NH_3$ and remaining gas are removed therefrom. Thereafter, the inner pressure of the reaction tube 5 is recovered to about 760 Torr, and the boat 8 is unloaded therefrom.

Conventionally, such temperature raising process is performed, while the inner pressure of the reaction chamber is maintained at a depressurized state, e.g., about 0.1 Torr. In contrast, in this preferred embodiment, the temperature is raised, while the inner pressure of the reaction chamber 5 is maintained at a pressure, e.g., 760 Torr or 10 Torr, higher than the vacuum-evacuated pressure. Moreover, the pressures maintained in the reaction chamber 5 during the temperature raising stages are greater than the film forming pressure. Hence, there exists a relatively thicker air pocket between the supporting portion 27a and the periphery surface of the wafer 10 supported by the supporting groove 28. The relatively thick air pocket serves to reduce the frictional coefficient when there occur relative displacements therebetween due to, e.g., the difference between thermal expansion coefficient thereof. Therefore, scrapes or damages occurring on a bottom surface of the wafer 10 are reduced, so that the generation of the contaminant particles is reduced, and the amount of the contaminant particles attached on the wafer 10 is also reduced.

Figure 12:
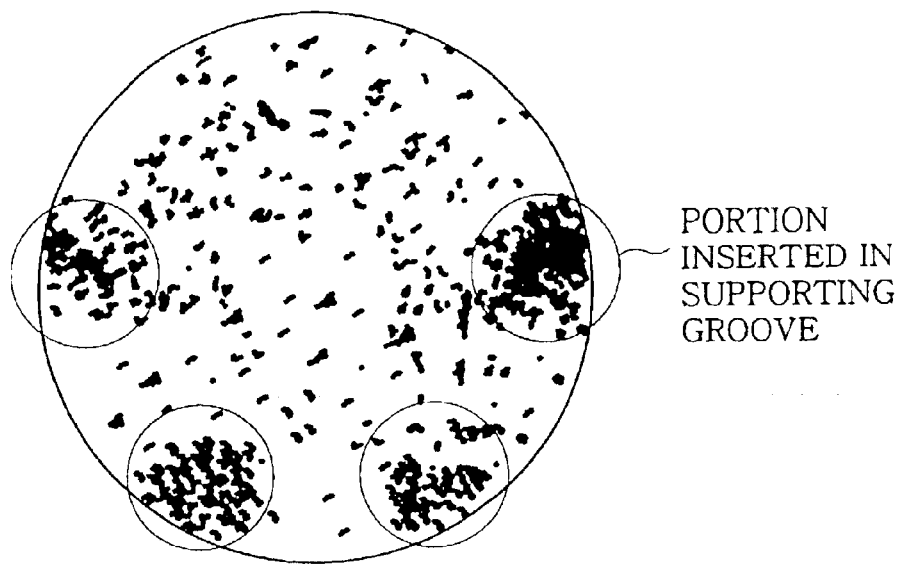
FIG. 12 shows a distribution of the contaminant particles formed on a conventionally processed wafer.

Referring to FIG. 12, there is illustrated a distribution of the contaminant particles formed on a conventionally processed wafer. And another distribution of the contaminant particles formed on a wafer processed in accordance with the second preferred embodiment is shown in FIG. 13.

Figure 13:
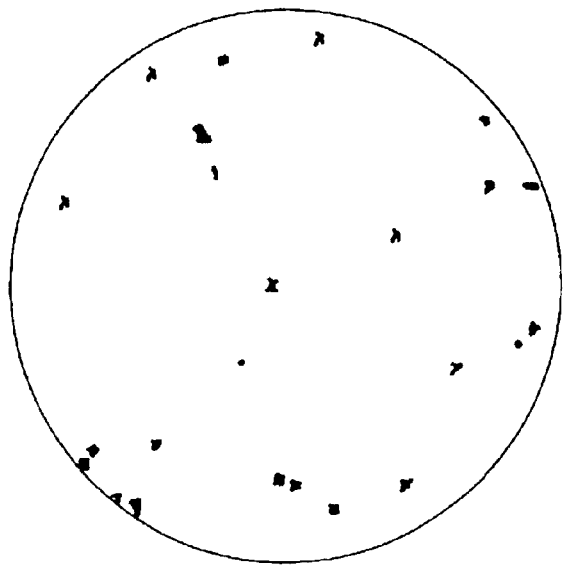
FIG. 13 offers a distribution of the contaminant particles attached on a wafer processed in accordance with the present invention.

It can be seen from FIGS. 12, 13 that the amount of the contaminant particles formed on a wafer is significantly reduced when processed according to the present invention.

Figure 14:
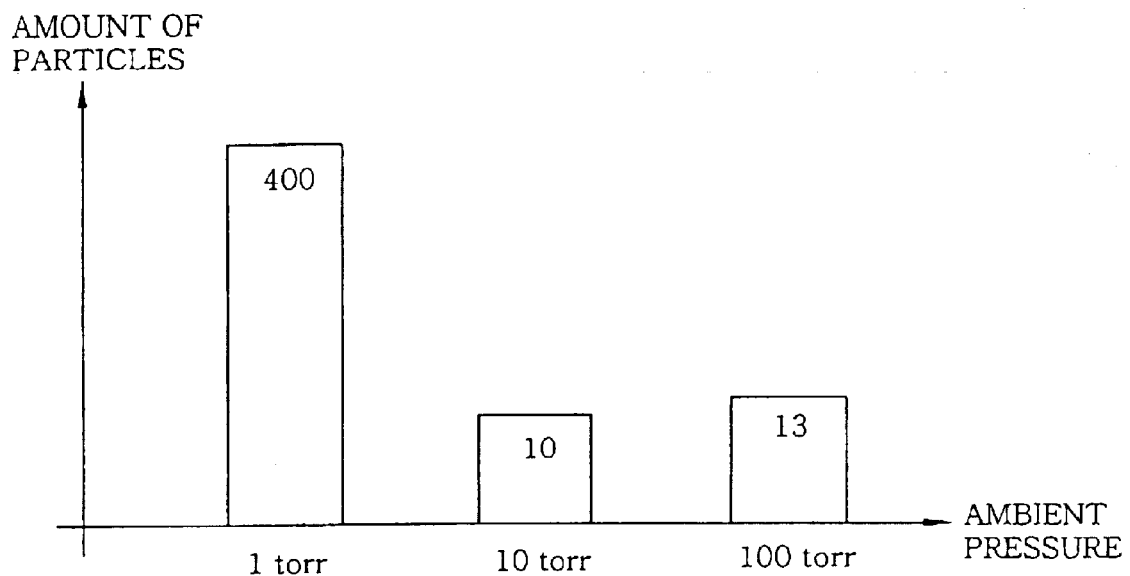
FIG. 14 is a bar graph displaying a relationship between contaminant particles formed on a wafer and an ambient pressure.

There is provided in FIG. 14 a correlation between the amount of the contaminant particles formed on a wafer and the ambient pressure during the temperature raising process.

As shown in FIG. 14, at the ambient pressure of about 1 Torr (133 Pa), about 400 contaminant particles were formed on a wafer. But in a case of the ambient pressure at about 10 Torr (1333 Pa), the number of the particles formed on a wafer was phenomenally reduced to about 10. However, there was no significant improvement in the formation of contaminant particles on a wafer when the ambient pressure was varied from about 10 Torr to about 100 Torr (13332 Pa), wherein the number of particles at 100 Torr was 13.

As a result, it is preferable to maintain the ambient pressure equal to or greater than about 10 Torr in view of the amount of the contaminant particles. In addition, taking into account the time required in increasing the ambient pressure and the amount of gas required, it is preferable that the ambient pressure be maintained in a range from about 10 (1333 Pa) to 20 Torr (2666 Pa), and more preferably, at about 10 Torr.

In the substrate processing apparatus of the second preferred embodiment, it takes about 10 minutes or more to raise the ambient pressure to about 100 Torr, whereas it only takes about 1 minute 30 seconds to raise it to about 10 Torr.

An equivalent effect can be obtained in forming a poly-Si or a CVD natural oxide film as in the case of forming the BTBAS-Nitride film. Furthermore, an equivalent effect can be achieved by employing the principle of the preferred embodiments to a single wafer CVD apparatus or a plasma CVD apparatus.

In essence, it is crucial to maintain the boat ambient pressure equal to or greater than about 10 Torr when the wafer is thermally expanded.

As described above, in the present invention, the wafers are loaded into the boat disposed in the waiting room located adjacent to the reaction furnace, and then the waiting room is vacuum-evacuated. And since the boat ambient pressure is maintained in the pressure range greater than the vacuum-evacuated pressure and less than the atmospheric pressure, while the boat is being loaded into the reaction furnace or while the temperature of the reaction chamber is being recovered after the boat has been loaded thereinto, the generation of the contaminant particles and the formation of the natural oxide films can be suppressed. Therefore, a quality substrate processing becomes possible and a yield of finer semiconductor devices may not be degraded.

Further, in a semiconductor device fabricating method including the steps of increasing the temperature of the substrates supported by the boat to a processing temperature; vacuum-evacuating the reaction chamber; and processing the substrates by supplying processing gases thereinto, the pressure of the reaction chamber is maintained in the pressure range greater than the vacuum-evacuated pressure and less than the atmospheric pressure during the step of raising the temperature of the substrates. Thus the friction force between the peripheral surface of the substrates and the supporting grooves of the boat is reduced and the generation of the contaminant particles is suppressed. Accordingly, the quality of semiconductor devices and the yield thereof can be improved.

While the invention has been shown and described with respect to the preferred embodiments, it will be understood by those skilled in the art that various changes and modifications may be made without departing from the spirit and scope of the invention as defined in the following claims.

What is claimed is:

1. A semiconductor device fabricating method, comprising the steps of:

loading one or more substrates into a substrate holder disposed in a waiting room positioned next to a reaction furnace;

vacuum-evacuating the waiting room to a vacuum state at a base pressure;

loading the substrate holder from the waiting room into the reaction furnace at a first pressure; and recovering a temperature of the reaction furnace at a second pressure, wherein the first or the second pressure is greater than the base pressure but less than the atmospheric pressure.

2. A semiconductor device fabricating method, comprising the steps of:

loading one or more substrates into a substrate holder disposed in a waiting room positioned next to a reaction furnace;

loading the substrate holder from the waiting room into the reaction furnace at a first pressure; and recovering a temperature of the reaction furnace at a second pressure, wherein the first pressure is less than the second pressure.

3. The semiconductor device fabricating method of claim 1, wherein the first pressure is maintained at a range from about 650 to 3000 Pa.

4. The semiconductor device fabricating method of claim 1, further comprising the step of raising a temperature of said one or more substrates at a third pressure, wherein the third pressure is greater than the base pressure but less than the atmospheric pressure.

5. A semiconductor device fabricating method, comprising the steps of:
- loading a substrate holder having one or more substrates into a reaction furnace;
- vacuum-evacuating the reaction furnace to a vacuum state at a base pressure;
- recovering a temperature of the reaction furnace at a prescribed pressure; and
- processing said one or more substrates by supplying one or more processing gases into the reaction furnace,
- wherein the prescribed pressure is greater than the base pressure but less than the atmospheric pressure.

6. The semiconductor device fabricating method of claim 5, wherein the prescribed pressure ranges from about 1300 to 3000 Pa.

7. A semiconductor device fabricating method, comprising the steps of:
- vacuum-evacuating a reaction furnace to a vacuum state at a base pressure;
- increasing a temperature of one or more substrates supported by a substrate holder in the reaction furnace at a prescribed pressure; and
- processing said one or more substrates by supplying one or more processing gases into the reaction furnace,
- wherein the prescribed pressure is greater than the base pressure but less than the atmospheric pressure.

8. The semiconductor device fabricating method of claim 7, wherein the prescribed pressure is equal to or greater than about 1333 Pa (10 Torr).

9. The semiconductor device fabricating method of claim 7, wherein the step of increasing the temperature is carried out by raising a temperature of the reaction furnace.

10. A semiconductor device fabricating method, comprising the steps of:
- loading a substrate holder having one or more substrates into a reaction furnace;
- vacuum-evacuating the reaction furnace to a vacuum state at base pressure;
- processing said one or more substrates by supplying one or more first processing gases into the reaction furnace at a first processing temperature and at a first pressure;
- processing said one or more substrates by supplying one or more second processing gases into the reaction furnace at a second temperature and at a second pressure; and
- performing a temperature change from the first processing temperature to the second processing temperature at a third pressure; and
- wherein the third pressure is greater than the base pressure but less than the atmospheric pressure.

11. The semiconductor device fabricating method of claim 10, wherein the second processing temperature is higher than the first processing temperature.

12. The semiconductor device fabricating method of claim 10, wherein the third pressure is greater than at least one of the first and the second pressures but less than the atmospheric pressure.

13. The semiconductor device fabricating method of claim 10, wherein the third pressure is equal to or greater than about 1333 Pa (10 Torr).

* * * * *